(12) United States Patent
Tzeng et al.

(10) Patent No.: US 6,180,503 B1
(45) Date of Patent: Jan. 30, 2001

(54) PASSIVATION LAYER ETCHING PROCESS FOR MEMORY ARRAYS WITH FUSIBLE LINKS

(75) Inventors: Wen-Tsing Tzeng, Taichung; Chun-Pin Yang, Hsin-Chu; Hsing-Lien Lin, Kaohsiung, all of (TW)

(73) Assignee: Vanguard International Semiconductor Corporation, Hsin-Chu (TW)

( * ) Notice: Under 35 U.S.C. 154(b), the term of this patent shall be extended for 0 days.

(21) Appl. No.: 09/354,852

(22) Filed: Jul. 29, 1999

(51) Int. Cl.[7] .......................... H01L 21/44; H01L 21/332
(52) U.S. Cl. .......................... 438/601; 438/600; 438/132; 438/6; 257/529
(58) Field of Search .................................. 438/600, 601, 438/132, 6; 257/529

(56) References Cited

U.S. PATENT DOCUMENTS

| | | | |
|---|---|---|---|
| 5,235,205 | 8/1993 | Lippitt, III | 257/528 |
| 5,241,212 | 8/1993 | Motonami et al. | 257/529 |
| 5,567,643 | 10/1996 | Lee et al. | 437/60 |
| 5,618,750 | 4/1997 | Fukuhara et al. | 438/601 |
| 5,627,400 | * 5/1997 | Koga | 257/529 |
| 5,789,795 | 8/1998 | Sanchez et al. | 257/530 |
| 5,821,160 | 10/1998 | Rodriguez et al. | 438/601 |
| 5,965,927 | * 10/1999 | Lee et al. | 257/529 |
| 5,990,537 | * 11/1999 | Endo et al. | 257/529 |
| 6,004,834 | * 12/1999 | Tsukude et al. | 438/132 |
| 6,008,075 | * 12/1999 | Lien et al. | 438/132 |
| 6,037,648 | * 3/2000 | Arndt et al. | 438/529 |
| 6,124,165 | * 9/2000 | Lien | 438/253 |

OTHER PUBLICATIONS

S. Wolf, "Silicon Processing For the VLSI Era," vol. 2: Process Integration, pp. 598–599, (1990), and vol. 3: The Submicron MOSFET, (1995), p. 275, Lattice Press, Sunset Beach CA.

* cited by examiner

Primary Examiner—Richard Booth
Assistant Examiner—Jennifer M. Kennedy
(74) Attorney, Agent, or Firm—George O. Saile; Stephen B. Ackerman

(57) ABSTRACT

A method is described for progressively forming a fuse access openings in integrated circuits which are built with redundancy and use laser trimming to remove and insert circuit sections. The fuses are formed in a polysilicon layer and covered by one or more relatively thin insulative layers. An etch stop is patterned over the fuse in a higher level polysilicon layer or a first metallization layer. Additional insulative layers such as inter-metal dielectric layers are then formed over the etch stop. A first portion of the laser access window is then etched during the via etch for the top metallization level. The etch stop prevents removal of the insulation subjacent to it. Cumulative thickness non-uniformities in the relatively thick upper insulative layers are thus removed from the fuse window. The etch stop is removed during patterning of the top level metallization. A passivation layer is applied and patterned to exposed bonding pads and, at the same time complete the etching of the laser access window to a desired thickness over the fuses. The passivation layer over etch required to penetrate the insulation layer over the fuses also removes an ARC over the bonding pads. The process fit conveniently within the framework of an existing process and does not introduce any additional steps. In addition, the passivation layer can be patterned to form final access to both bonding pads and laser access openings with a single photolithographic mask.

19 Claims, 10 Drawing Sheets

PASSIVATION LAYER ETCHING PROCESS FOR MEMORY ARRAYS WITH FUSIBLE LINKS

BACKGROUND OF THE INVENTION (1) Field of the Invention

The invention relates to processes for the manufacture of semiconductor devices and more particularly to processes for manufacturing memory arrays with fusible links.

(2) Description of Prior Art

Computer memory chips consist of vast arrays of storage cells which can be addressed by wordlines and bitlines. Each cell corresponds to one bit. The most commonly used cell design used in current dynamic random access memories (DRAMs) comprise a transfer gate(usually an MOS field-effect-transistor(MOSFET) and a storage node consisting of a capacitor. DRAM cells are, by necessity of high density and of simple design. To this end, the MOSFET-capacitor combination serves quite well. Static-random-access-memories(SRAMs) are slightly more complex, requiring four to six MOSFETs per cell.

The cell quantity requirements for memory are increasing at a phenomenal rate. Whereas the SRAMs of 1991 were of the order of 4 megabits, the density by the year 2001 is predicted to be 256 megabits or more. DRAMs have even greater cell density requirements. See e.g. S. Wolf, "Silicon Processing for the VLSI Era", Vol. II, Lattice Press, Sunset Beach, Calif. (1990) p.598ff, and Vol. III (1995) p.275. The occurrence of a single defect in such a complex integrated circuit(IC) renders the entire body useless.

Obviously, the manufacturing functional yield of memory chips would rapidly approach zero if steps were not taken to circumvent such defective components. To this end, additional segments of memory circuits are provided on the IC chip as replacements for defective segments. Fortunately, memory arrays, by virtue of their repetitive design, lend themselves particularly well to the incorporation of such redundant segments. Although, additional space is required for these extra circuits, the yield benefits they provide make them very cost effective.

The manner in which these redundant segments are utilized and defective segments deleted is accomplished by means of laser trimming. A description of the design layout and implementation of such redundant circuits need not be given here but may be found in Motonami et.al., U.S. Pat. No. 5,241,212. The segments are provided with fusible links or fuses which are ruptured or blown as required, by a laser, after IC processing has been completed and functional testing with probes is possible. The functional testing determines which segments are defective and a laser, usually a neodymium YAG laser, is directed at the appropriate fusible links, thereby breaking the circuit.

The fusible links are formed as part of one of the metallization layers of the IC. Typically, a lower level, such as a polysilicon level is used. This level would, for example, contain the word-lines of a DRAM array. Prior to Laser trimming, the interlevel dielectric layers above the fusible link are sometimes removed entirely and replaced by a thinner protective layer to provide a short uniform path for the laser and confine the resultant debris. In other cases, the thick dielectric layers are etched down to a pre-determined thickness above the link. The laser energy required to blow the fuse is proportional to the thickness of the dielectric material above the fuse.

The laser access window is commonly opened in a final etch step after the uppermost metallization level has been patterned and a final passivation layer has been deposited. The passivation layer is patterned to form access openings to bonding pads in the uppermost metallization level and, simultaneously form access openings to the fuses. At the bonding pads, the etch must penetrate the passivation layer, which is between about 0.5 and 1.5 microns thick, and a 200 to 400 Angstrom thick ARC (anti-reflective coating) on the pad. However, the fuse openings must pass through, not only the passivation layer, but an additional thickness of subjacent insulative layers varying between about 0.8 and 1.4 microns. Even though etch rate selectivities favorable for etching insulative material over metallization are used, it is difficult to etch the entire fuse opening simultaneously with the bonding pad openings without either degrading the bonding pad by over etching, or leaving too much or too little or no insulator over the fuses. In current technology, the ARC over the bonding pads must also be removed by the passivation layer patterning step. This requires significant over-etching of the bonding pad and often results in excessive or total removal of insulative layer over the fuses. Exposure of the fuses subjects them to atmospheric moisture and corrosion.

Rodriguez, et.al., U.S. Pat. No. 5,821,160 addresses the problem of cumulative non-uniformities in an SRAM (static random access memory) developed in the multiple insulative layers between the fuses an the passivation layer by providing an etch stop in a polysilicon layer which lies just one insulative layer above the fuses. The polysilicon layer which used to form the poly load resistors of the SRAMs is patterned to include plates of polysilicon over the fuse regions. These plates are located on a layer of about 4,000 Angstroms of silicon oxide which is formed directly on the fuses. The plates serve as an etch stop during the fuse opening etch so that a uniform oxide layer remains over the fuses. Although this procedure assures a uniform thickness of insulator over the fuses, a large etch depth differential between the bonding pad openings and the fuse access openings still remains.

Lippitt, U.S. Pat. No. 5,235,205, like Rodriguez provides an etch stop, patterned in a metallization level over a fuse, to permit the opening both bonding pads completely and fuse access openings to a fixed level without using a time dependent etch. However, in both instances, unless the etch stop material can be subsequently etched selectively while the bonding pads are exposed, the etch stop cannot be removed without using an additional photomask to protect the bonding pads. This requirement, in order to save a photolithographic step is not a welcome design limitation.

Fukuhara, et.al., U.S. Pat. No. 5,618,750 shows methods for forming fuse structures which have non-corrosive elements to prevent corrosion damage to surrounding components after the fuse is blown. Lee, et.al., U.S. Pat. No. 5,567,643 describes a guard ring structure around a fuse which protects nearby components from corrosion damage after the fuse is blown. Sanchez, et.al., U.S. Pat. No. 5,789,795 shows the shows the formation of an anti-fuse wherein a dielectric etch stop layer is deposited directly on the layer of anti-fuse material.

SUMMARY OF THE INVENTION

It is an object of this invention to provide a method for progressively forming fuse access openings and simultaneously etching a passivation layer and bonding pad openings.

It is another object of this invention to provide a method for retarding fuse access opening formation during via formation by the use of transient etch stop layers.

It is another object of this invention to provide a method for improving the uniformity of insulative layers over fuse links while at the same time sufficiently over-etching vias and passivation layer access openings to thoroughly remove ARC layers.

It is yet another object of this invention to provide a method for patterning a passivation layer to form access to bonding pads and laser access openings with a single photolithographic mask.

These objects are accomplished by using etching the laser access opening in two steps using a transient etch stop layer between the first and second step. After a fuse is formed in a polysilicon level, an etch stop pad is patterned in a higher level metal or polysilicon level over the rupture zone of the fuse. The fuse access opening is then partially formed concurrent with a via etch which penetrates a relatively thick IMD layer. The etch stop pad limits the penetration over the rupture zone to only the IMD layer. The etch stop pad is removed during a metal patterning etch. The second and final portion of the access opening is then formed during patterning of the passivation layer. Because the etch stop pad has already been removed at passivation etching, the bonding pads opening and the final fuse access opening can be accomplished by a single mask. The invention may be accomplished in an existing process without introducing additional processing steps.

DESCRIPTION OF THE PREFERRED EMBODIMENTS

A first embodiment of this invention and the method for its manufacture will be described in greater detail. The improved structure of this alignment mark will become apparent during the discussion of the method of its formation.

Figure 1A:
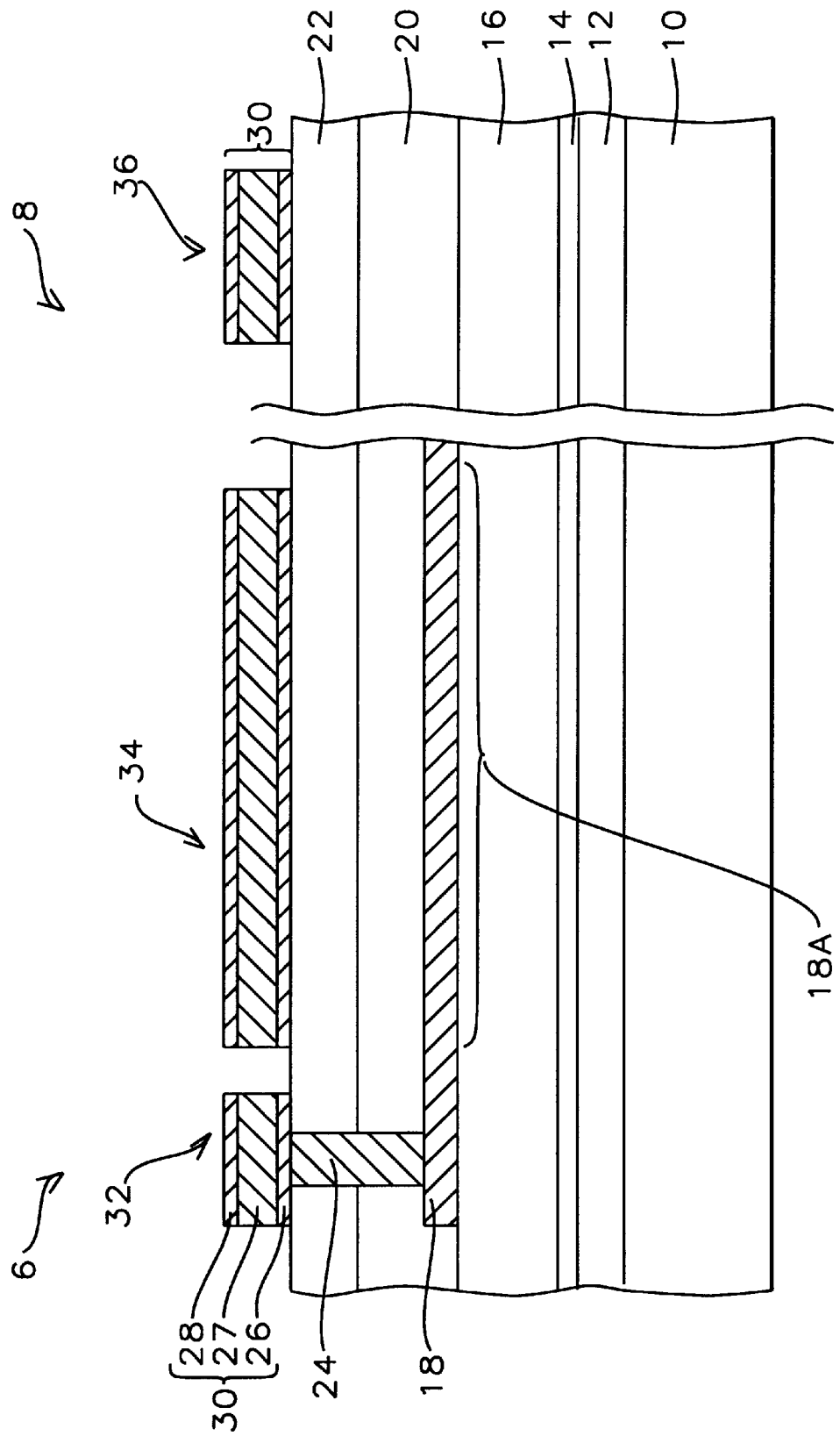
FIG. 1A through FIG. 1E are cross sections of a DRAM product showing the process steps for forming a fuse access window according to a first embodiment of this invention.

In a first embodiment of this invention a fuse is formed in a polysilicon layer of a DRAM and an access opening to the fuse is progressively formed during the subsequent processing steps. No additional processing steps are introduced by the method of the invention. Referring to FIG. 1A, a p-type <100> oriented monocrystalline silicon wafer 10 is provided. The wafer 10 is processed using conventional DRAM manufacturing procedures for the incorporation of semiconductor devices (not shown).

A field oxide 12 is formed to isolate the semiconductor devices and is present below the region wherein fusible links (fuses) are to be formed. The field oxide 12 is formed by the well known LOCOS (local oxidation of silicon) to a thickness of 2,000 Angstroms or thereabout. FIG. 1A shows cross sections of a region 6 which is a fuse region and another region 8 in which a bonding pad will later be formed. The circuit design for this embodiment comprises a DRAM array having one or more redundant segments in a region adjacent to the primary memory array. Elements of the DRAM integrated circuit are concurrently formed elsewhere on the wafer. These elements will be referred to but are not shown in the figures. Fuses are provided for each replaceable segment in the primary array and fuses to insert redundant segments are similarly provided. In FIG. 1A a fuse 18 is patterned in a second polysilicon layer of the DRAM process. This is the polysilicon layer in which the bit line of the DRAM cell is also patterned. The section 18A of the fuse 18 is designated as the region over which an access window will be formed in subsequent processing, allowing a laser beam to cause an open in the fuse.

A silicon oxide layer 14 is formed over the field oxide layer 12. The layer is formed by the well known CVD (chemical vapor deposition) of TEOS (tetraethoxyorthosilicate) to a thickness of between about 800 and 1,100 Angstroms. In the DRAM cell array the TEOS silicon oxide layer 14 covers the patterned wordlines. A BPSG (borophosphosilicate glass) layer 16, having a thickness of 5,000 Angstroms or thereabout is deposited, preferably by PECVD (plasma enhanced CVD), on the silicon oxide layer 14. Together, the BPSG layer 16 and the oxide layer 14 form a first IPO (inter polysilicon oxide) layer. BPSG layer 16 is planarized by CMP (chemical mechanical polishing) and openings (not shown) for the bitline contacts are then etched in the layer. A first layer of in-situ doped polysilicon is blanket deposited over the wafer and patterned to form the bitlines in the cell array and simultaneously, the fuse element 18 in the region 6. A second BPSG layer 20 is formed over the fuse 18 in region 6. The BPSG layer 20 forms the base upon which the broadened or crown portion of the DRAM cell storage capacitor is built. The BPSG layer 20 consists of a lower portion, referred to as a C2 oxide and an upper, separately deposited portion which is referred to as a crown oxide. Both portions are deposited by similar conventional CVD techniques. The BPSG layer 20 is deposited to a total thickness of the two portions of between about 0.8 and 1.3 microns.

An ILD (inter level dielectric) layer 22 is deposited over the BPSG layer 20. This layer is a TEOS silicon oxide deposited by PECVD to a thickness of 4,000 Angstroms or thereabout, In the DRAM cell array, the ILD layer 22 lies over the storage cell capacitor. The ILD layer 22 is planarized, preferably by CMP.

A conductive plug 24 is formed through the insulative layers 20,22 contacting the fuse element 18 whereby the fuse element is connected to portions of the integrated circuit which are to be fused. The conductive plug 24 is preferably a tungsten plug although another conductive material may be used. Methods for forming interlevel conductive plugs are well known. A second connection (not shown) to the fuse 18 is made elsewhere, on the opposite side of the rupture zone 18A from the connection 24, to a second portion of the integrated circuit so that, if the fuse is ruptured in the fusible region 18A, an open will occur between the two portions. The zone 18A is the fusible or rupture zone of the fuse.

A first metallization level 30 is next deposited and patterned on the layer 22. A Ti/TiN adhesion/barrier layer 26 is deposited, preferably by sputtering. Ti/TiN adhesion/barrier layers are well known and typically applied at the base of the metallization layer. The layer 26 is between about 200 and 300 Angstroms thick overall. A metal layer 27 consisting of an aluminum alloy is deposited on the adhesion/barrier layer 26 to a thickness of between about 4,000 and 6,000 Angstroms. Alternately, other conductive materials may be used to form the metal layer 27, for example aluminum, tungsten, copper, a tungsten alloy or a copper alloy. The layer 27 is deposited by a PVD (physical vapor deposition) method such as sputtering or vacuum evaporation. Alternately a MOCVD (metal-organic CVD) deposition may be employed. An ARC 28 is deposited over the aluminum layer 27 to reduce reflections from the metal surface during photo patterning. The ARC 28 comprises a layer of TiN between about 200 and 400 Angstroms thick deposited by sputtering. Alternately, the ARC may comprise TaN or silicon oxynitride. The first metallization layer 30, which comprises the adhesion/barrier layer 26, the main conductive layer 27 and the ARC 28 is patterned by conventional photolithographic methods to form a connection to the conductive plug 24, a plate 32 which overlies a portion of the fuse element 18 and completely covers a region where an access opening to the fuse is to be formed. Plate 32 is transient and is deployed as an etch stop whereafter it will be removed in processing before the application of a passivation layer. In addition a section of metallization 36 is patterned from the layer 30 in the region 8 which will form a connection from first metal wiring to a bonding pad.

Figure 1B:
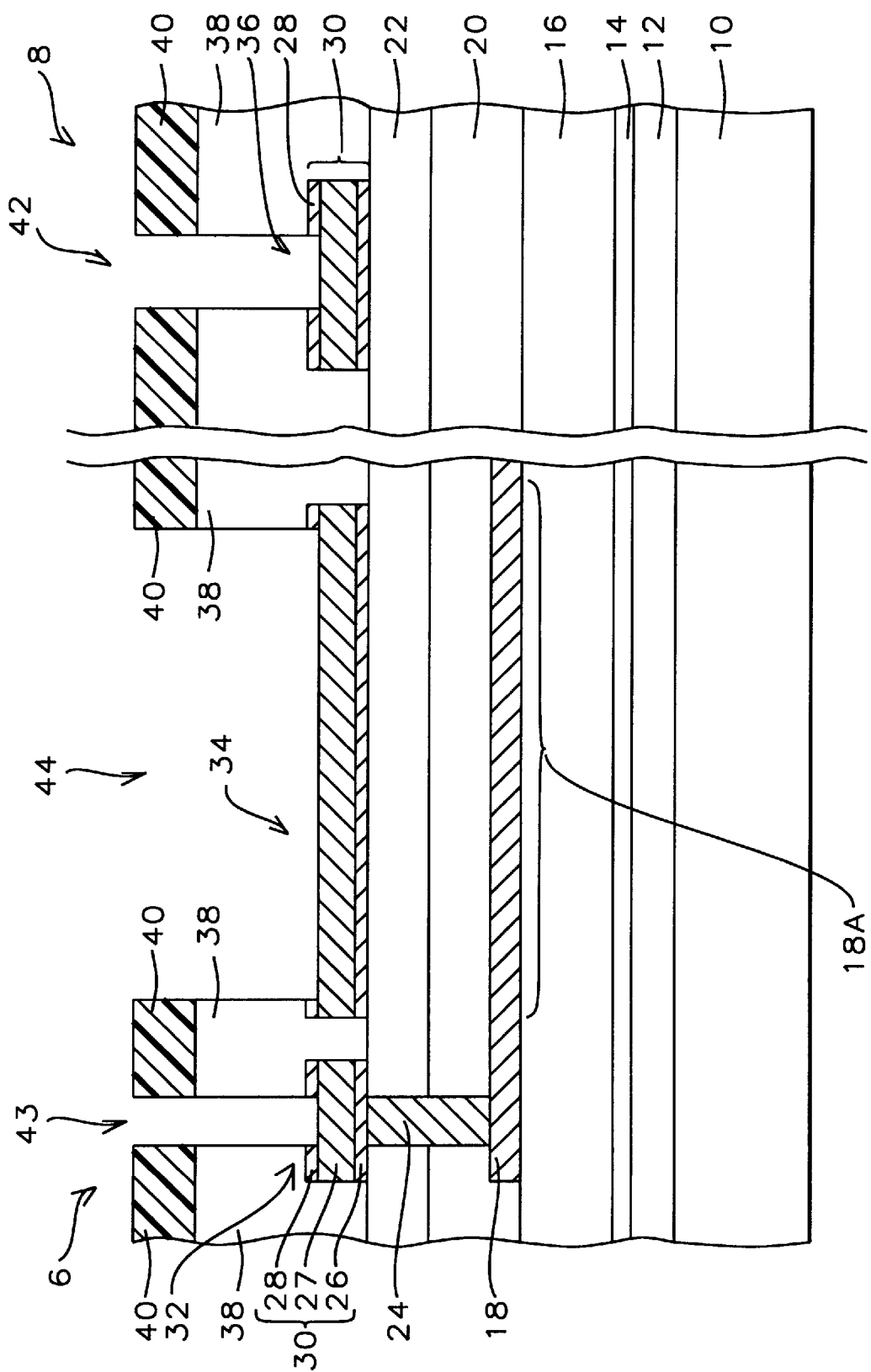

Referring to FIG. 1B, an IMD (inter-metal dielectric) layer 38 between about 0.8 and 1.3 microns thick is deposited over the first level metallization pattern 32, 34, 36. The IMD layer 38 is formed of a TEOS silicon oxide deposited by PECVD. The IMD layer 38 is planarized after deposition, preferably by CMP. Alternately, a spin-on-glass planarization method may be used.

Photoresist 40 is patterned on the IMD layer 38 and via openings 42, 43 are anisotropically etched to the wiring connection 32 and to the bonding pad connection 36. In addition, a first portion of a fuse access opening 44 etched, concurrent with the vias, Anisotropic etching of the IMD layer 38 is accomplished by well known plasma etching or RIE (reactive ion etching) methods using etchant gases containing fluorocarbons. The via openings 42 are over-etched by approximately 100 percent in order to remove the ARC 28 at the base of the openings. The etch stop plate 34 prevents the via etch from penetrating the subjacent insulative layers 22, 20 over the fuse 18.

The fuse access opening 44 is now partially formed and thickness non-uniformities contributed by the IMD layer 38 are eliminated from the total insulator stack over the fuse 18. The relatively thick IMD layer 38 would otherwise have contributed thickness non-uniformities across the wafer.

Figure 1C:
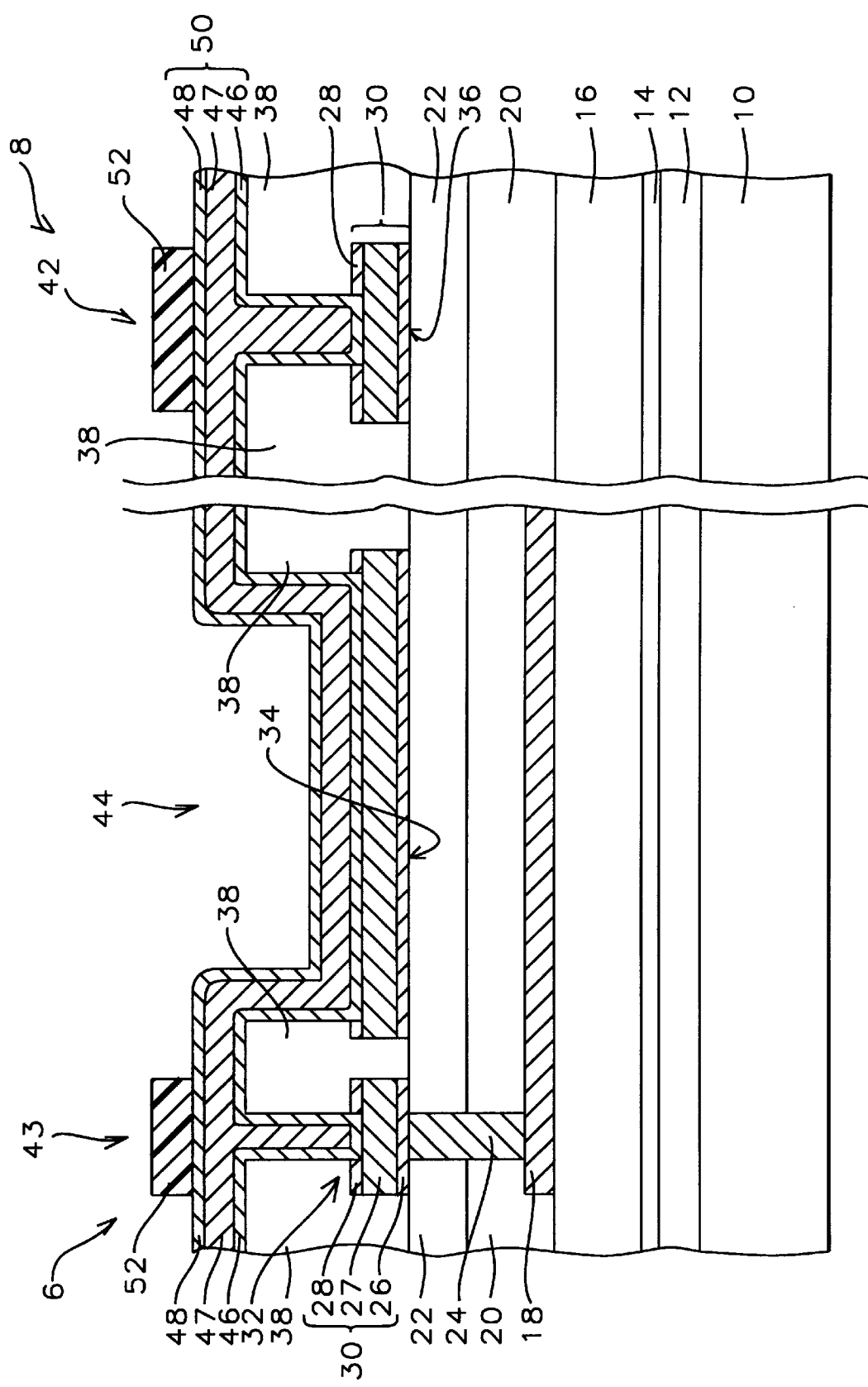

Referring to FIG. 1C, a second metal layer 50 is deposited over the IMD layer 38 filling the vias 42, 43 and covering the etch stop plate 34. The second metal layer 50 is formed in a like manner to the first metal layer 30, being comprised of an adhesion/barrier layer 46 of Ti/TiN, between about 200 and 300 Angstroms thick, deposited by sputtering; a metal layer 47 consisting of an aluminum alloy, between about 0.4 and 0.9 microns thick, deposited by PVD or MOCVD; and an ARC 48 of TiN, between about 200 and 500 Angstroms thick deposited by sputtering. Alternatively, the ARC material may be TaN or silicon oxynitride. Alternately, another conductive materials may be used to form the metal layer 47, for example aluminum, tungsten, copper, a tungsten alloy or a copper alloy.

Photoresist 52 applied over the metallization layer 50 and patterned to define a bonding pad in the region 8 and an interconnection line in the region 6.

Figure 1D:
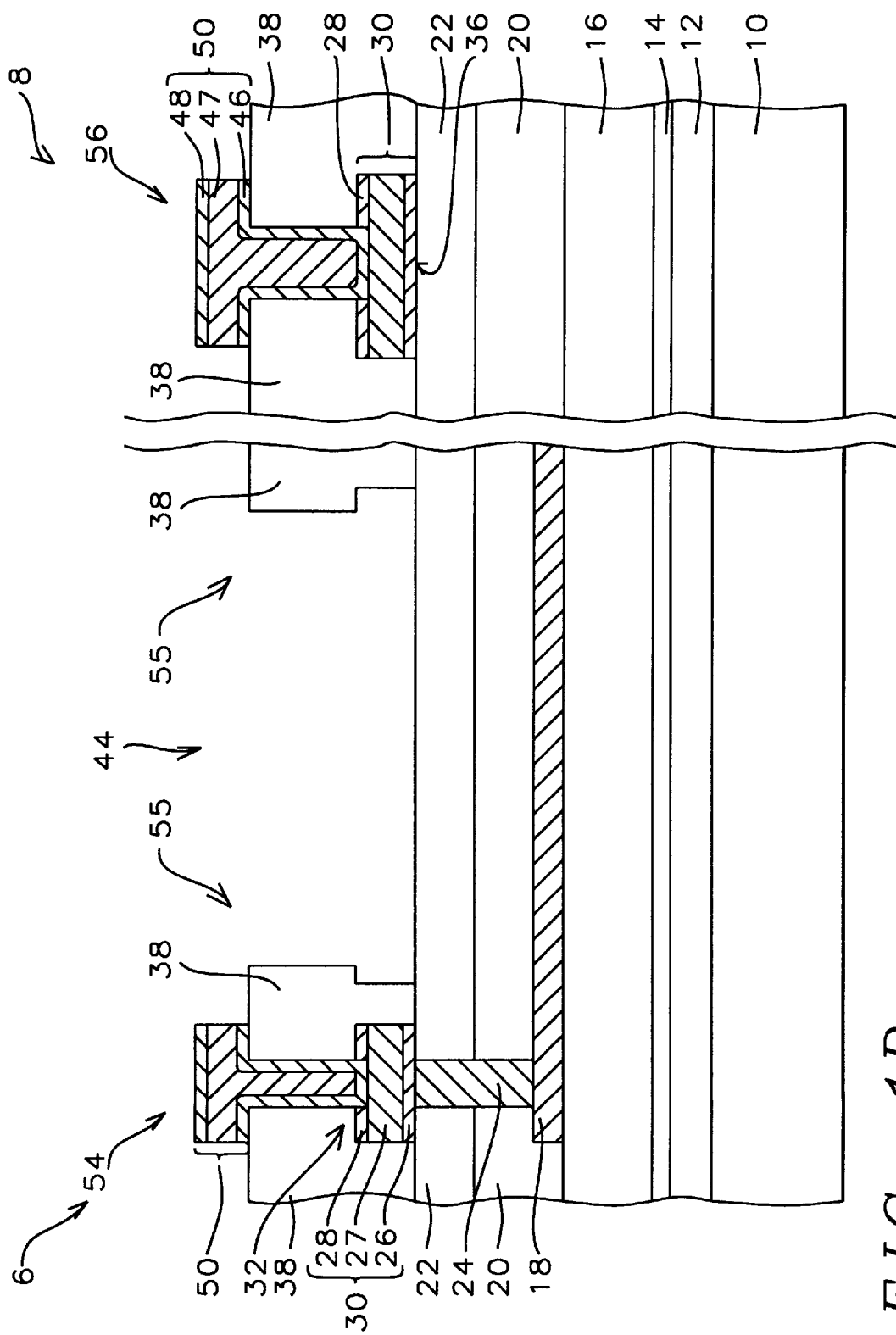

Referring to FIG. 1D the second metallization layer 50 is anisotropically etched to form an interconnect line 54 and a bonding pad 56. Anisotropic etching is accomplished by plasma etching in a plasma containing $Cl_2$. A high metal-to-silicon oxide etch rate selectivity is chosen by selection of the etching parameters and etch gas composition. These procedures are well known by those in the art. In the course of the plasma etching, the etch stop 34 at the base of the fuse access opening 44 is also removed and the insulative layer 22 is exposed.

Although the plasma etching conditions are anisotropic, residual metal along the vertical walls 55 in the fuse opening 44 does not remain after the etch process. The etchant parameters may be optimized to achieve these plasma etching conditions by well known plasma etching parametric variation methods. However, if residual metal remains along the sidewalls 55, in the slightly undercut region at the base of the opening 44, it is subsequently sealed off by a passivation layer and would therefore not become problematic.

The etch stop 34 in the fuse access opening 44 has been removed in the second metal patterning step. An additional masking step at passivation etching to protect the bonding pads is no longer required, and the limitation calling for different metals for the fuse and the second metal becomes moot. At the same time, the etch stop 34 has overcome the non-uniformity contribution of the thick IMD layer 38 and also permitted sufficient over etch to assure thorough removal of the ARC on the first metal without loss of subjacent insulator over the fuse 18. It remains now to apply and pattern a passivation layer over the second metallization.

Figure 1E:
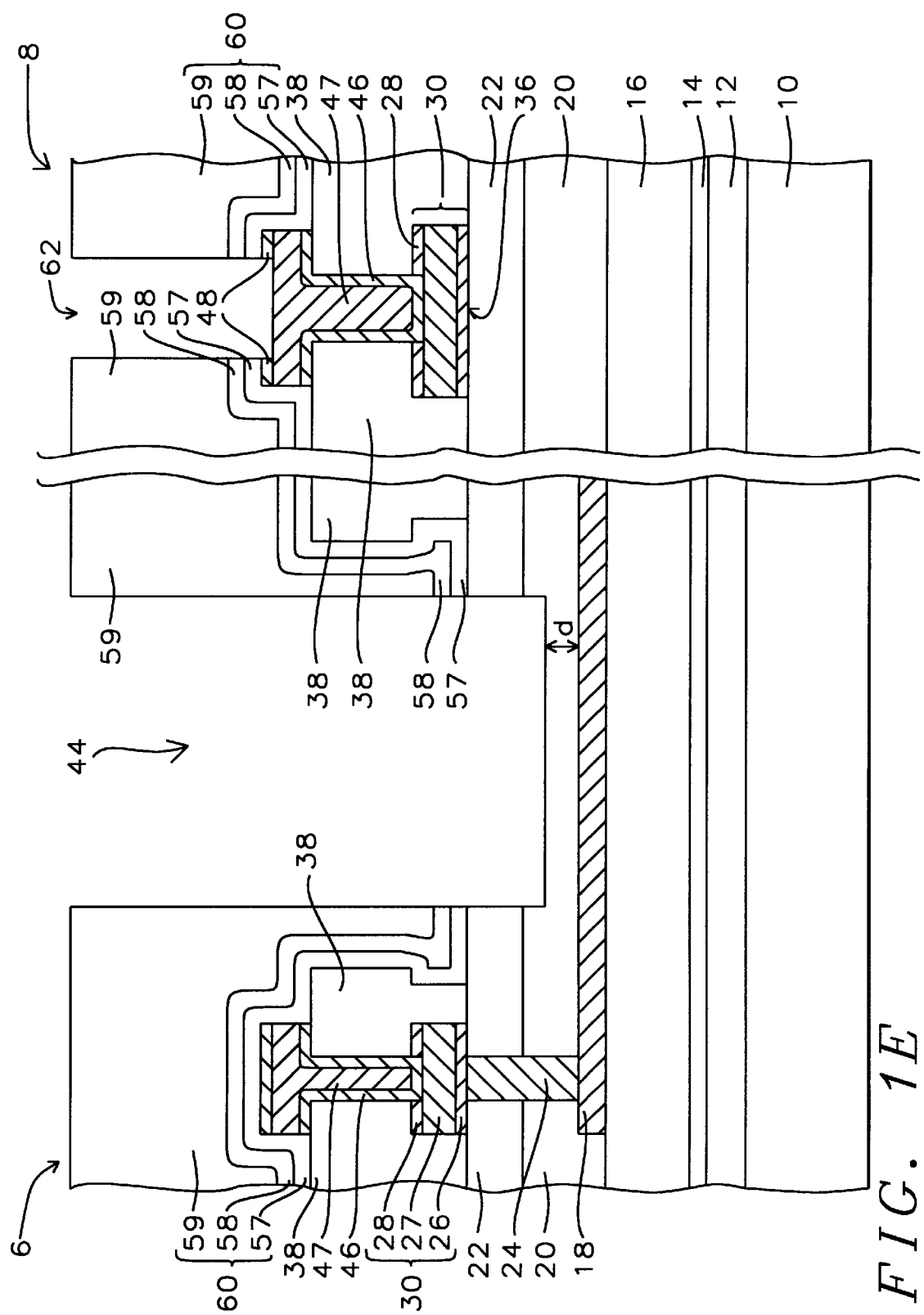

Referring to FIG. 1E, a silicon oxide layer 57 between about 0.4 and 0.7 microns thick is deposited over the wafer, covering the metallization pattern 47 with the superjacent ARC 48. A silicon nitride layer 58, between about 0.4 and 0.7 microns thick is deposited on the silicon oxide layer 57. Finally, a polyimide layer 59 is deposited over the silicon nitride layer. The polyimide layer 59 is deposited to a thickness between about 8 and 12 microns by a conventional spin on process. The passivation layer 60 comprises the silicon oxide layer 57, the silicon nitride layer 58 and the polyimide layer 59. Alternately the passivation layer 60 may take another form. For example the polyimide layer 59 may be omitted or replaced by a PSG (phosphosilicate glass) layer.

The passivation layer 60 is patterned by well known photolithographic patterning techniques and plasma etching or RIE methods, using etchant gases containing fluorocarbons, for example $CF_4$, to deepen the opening 44 through the insulative layer 22 and to create an opening 62 to the bonding pad 56. After the etchant penetrates the passivation layer 60, etching is continued for time period to pass the opening 44 through the ILD layer 22 and penetrate the BPSG layer 20 to leave a pre-determined thickness "d" of between about 0.2 and 0.6 microns over the fuse 18 at the base of the access opening 44. The ARC 48 exposed in the bonding pad opening 62, is entirely removed during this time period. Because the etch stop layer in the fuse access opening has been previously removed, the passivation layer etching step requires only a single mask.

Figure 2A:
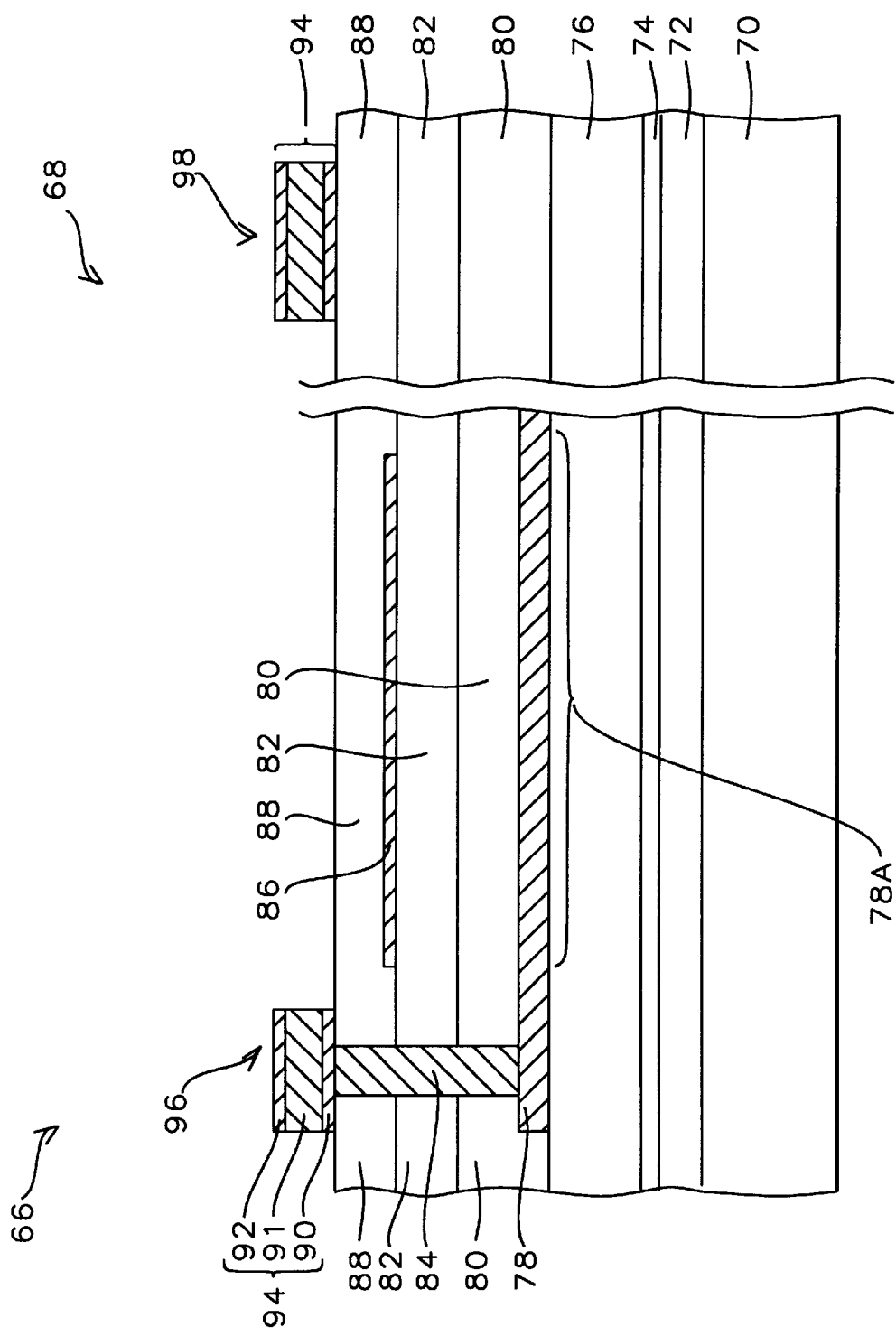
FIG. 2A through FIG. 2E are cross sections of a DRAM product showing the process steps for forming a fuse access window according to a second embodiment of this invention.

In a second embodiment of this invention an etch stop is formed in a polysilicon layer which is superjacent to a polysilicon fuse in order to preserve a uniform insulative covering in the fuse access opening during processing. No additional processing steps are introduced by the method of the invention. Referring to FIG. 2A, a p-type <100> oriented monocrystalline silicon wafer 70 is provided. The wafer 70 is processed using conventional manufacturing procedures for the incorporation of semiconductor devices (not shown).

A field oxide 72 is formed to isolate the semiconductor devices and is present below a region wherein a fusible link (fuse) is to be formed. The field oxide 72 is formed by the well known LOCOS (local oxidation of silicon) to a thickness of 2,500 Angstroms or thereabout. FIG. 2A shows cross sections of a region 66 which is a fuse region and another region 68 in which a bonding pad will later be formed. The circuit design for this embodiment comprises a DRAM array having one or more redundant segments in a region adjacent to the primary memory array. Elements of the DRAM integrated circuit are concurrently formed elsewhere on the wafer. These elements will be referred to but are not shown in the figures. Fuses are provided for each replaceable segment in the primary array and fuses to insert redundant segments are similarly provided. In FIG. 2A a fuse 78 is patterned in a second polysilicon layer of the DRAM process. This is the polysilicon layer in which the bitlines in the DRAM cell array are also patterned. The section 78A of the fuse 78 is designated as the region over which an access window will be formed in subsequent processing, allowing a laser beam to cause an open in the fuse.

A silicon oxide layer 74 is formed over the field oxide layer 72. The layer 74 is formed by the well known CVD (chemical vapor deposition) of TEOS (tetraethoxyorthosilicate) to a thickness of between about 800 and 1,100 Angstroms. In the DRAM cell the TEOS silicon oxide layer 74 covers the patterned wordlines.

A BPSG layer 76, having a thickness of 5,000 Angstroms or thereabout is deposited, preferably by PECVD, on the silicon oxide layer 74. Together, the BPSG layer 76 and the oxide layer 74 form a first IPO (inter polysilicon oxide) layer. BPSG layer 76 is planarized by CMP (chemical mechanical polishing) and openings (not shown) for the bitline contacts are then etched in the layer.

A layer of in-situ doped polysilicon is blanket deposited over the wafer and patterned to form the bitlines in the cell array and simultaneously, the fuse element 78 in the region 66. A second BPSG layer 80, referred to as a C2 oxide is deposited over the polysilicon fuse 78 by PECVD. The layer C2 oxide layer 80 forms the base upon which the broadened or crown portion of the DRAM cell storage capacitor is built in the cell array. Next, a third BPSG layer 82 is deposited over the C2 oxide layer 80. The layer 82 in a DRAM is commonly referred to as a crown oxide layer and, like the C2 oxide layer 80, is formed by PECVD. The combined thickness of the C2 oxide layer 80 and the crown oxide layer 82 is between about 0.8 and 1.3 microns.

A polysilicon layer is next deposited over the crown oxide 82 and patterned to form the upper cell plate of the storage capacitors in the DRAM array and concurrently, a plate 86 over the fuse 78 in the region 66. The plate 86 covers a region where an opening is to be formed to permit access by a laser trimming tool. In subsequent processing, the plate 86 will perform as an etch stop to prevent etching of the subjacent insulative layers over the fuse 78 during the patterning of a later deposited IMD layer. An ILD layer 88 is deposited over the crown oxide 82 and the patterned etch stop plate 86. The ILD layer 88 is formed of BPSG and is deposited by PECVD to a thickness of between about 3,500 and 4,500 Angstroms. The ILD layer 88 is planarized after deposition, preferably by CMP.

A conductive plug 84 is formed through the ILD layer 88, the crown oxide 82 and the C2 oxide 80, contacting the fuse element 78 whereby the fuse element is connected to a portion of the integrated circuit which is to be fused. The conductive plug 84 is preferably a tungsten plug although another conductive material may be used. Methods for forming interlevel conductive plugs are well known. A second connection (not shown) to the fuse 78 is made elsewhere, on the opposite side of the rupture zone 78A from the connection 84, to a second portion of the integrated circuit so that, if the fuse is ruptured in the fusible region 78A, an open will occur between the two portions. The zone 78A is the fusible or rupture zone of the fuse.

A first metallization level 94 is next deposited and patterned on ILD layer 88. A Ti/TiN adhesion/barrier layer 90 is deposited, preferably by sputtering. Ti/TiN adhesion/barrier layers are well known and typically applied at the base of the metallization layer. The adhesion/barrier layer 90 is between about 200 and 300 Angstroms thick overall. A metal layer 91 consisting of an aluminum alloy is deposited on the adhesion/barrier layer 90 to a thickness of between about 4,000 and 6,000 Angstroms. Alternately, other conductive materials may be used to form the metal layer 91, for example aluminum, tungsten, copper, a tungsten alloy or a copper alloy. The layer 91 is deposited by a PVD method such as sputtering or vacuum evaporation. Alternately a MOCVD deposition may be employed. An ARC 92 is deposited over the aluminum alloy layer 91 to reduce reflections from the metal surface during photo patterning. The ARC 92 comprises a layer of TiN between about 200 and 400 Angstroms thick deposited by sputtering. Alternately, the ARC may comprise TaN or silicon oxynitride. The first metallization layer 94, which comprises the adhesion/barrier layer 90, the main aluminum alloy conductive layer 91 and the ARC 92 is patterned by conventional photolithographic methods to form a connection to the conductive plug 84, and a section of metallization 98 in the region 68 which will form a connection from first metal wiring to a bonding pad.

Figure 2B:
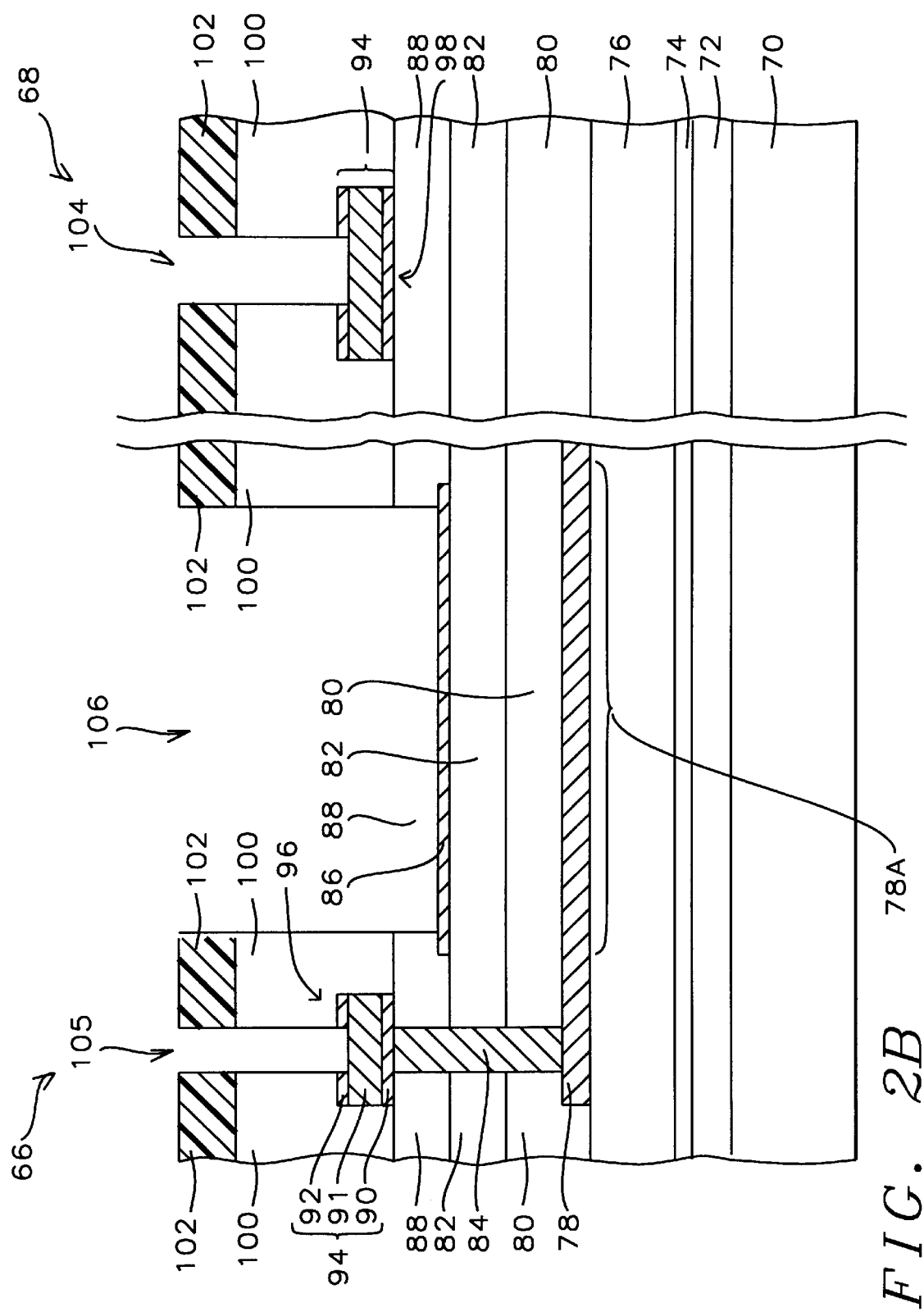

Referring to FIG. 2B, an IMD layer 100 between about 0.8 and 1.3 microns thick is deposited over the first level metallization pattern 96, 98. The IMD layer 100 is formed of a TEOS silicon oxide deposited by PECVD. The IMD layer 38 is planarized after deposition, preferably by CMP. Alternately, a spin-on-glass planarization method may be used.

Photoresist 102 is patterned on the IMD layer 100 and via openings 104, 105 are anisotropically etched to the wiring connection 96 and to the bonding pad connection 98. In addition, a first portion of a fuse access opening 106 is etched concurrently. Anisotropic etching of the IMD layer 100 is accomplished by well known plasma etching or by RIE using etchant gases containing fluorocarbons. The via openings 104, 105 are over-etched by approximately 100 percent in order to remove the ARC 92 at the base of the openings. Etching of the fuse access opening 106 stops at the plate 86. The fuse access opening 106 is now partially formed and thickness non-uniformities contributed by the IMD layer 100 are eliminated from the total insulator stack over the fuse 78. The relatively thick IMD layer 100 would otherwise have contributed thickness non-uniformities across the wafer.

Figure 2C:
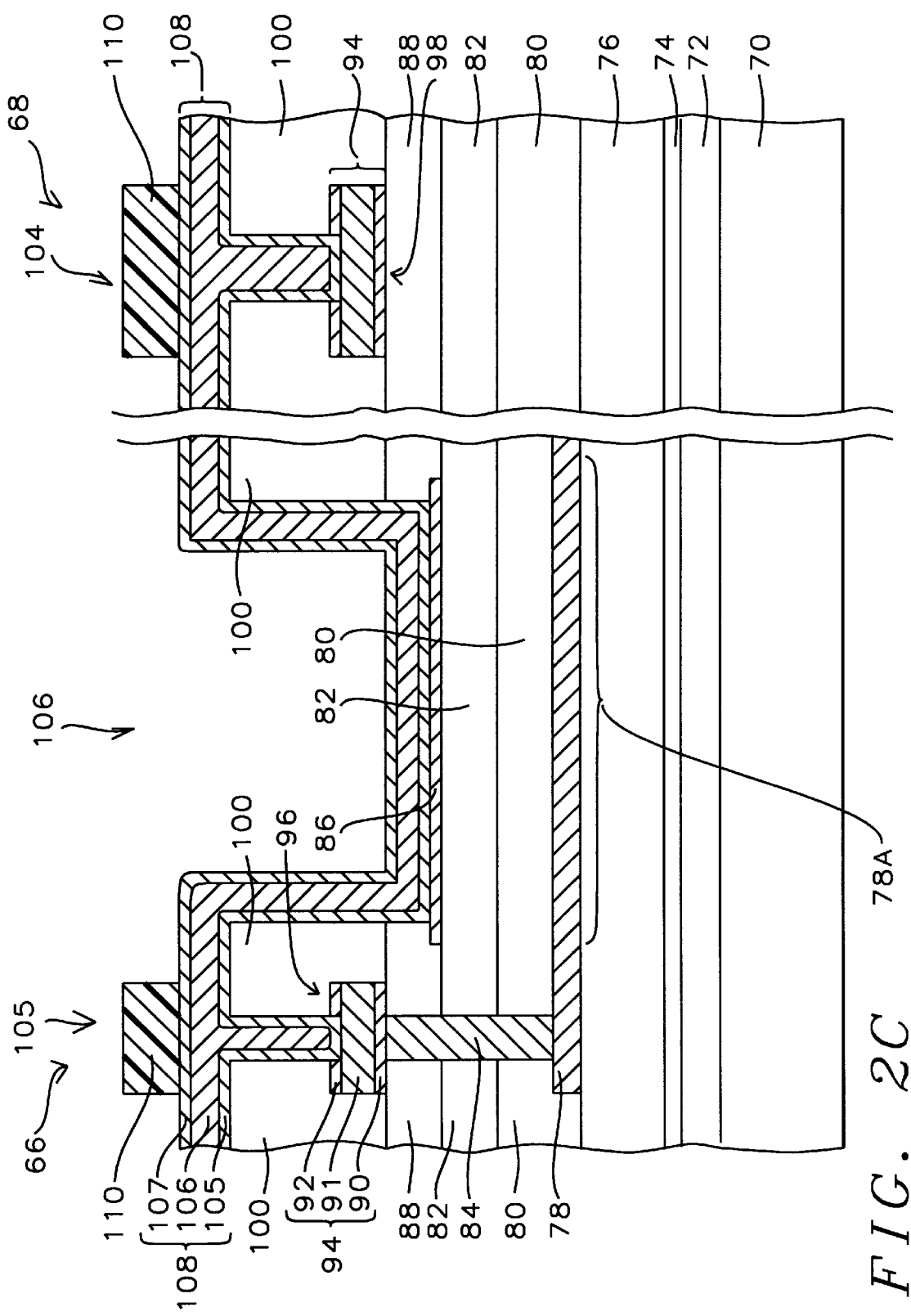

Referring to FIG. 2C, after stripping residual photoresist 102, a second metal layer 108 is deposited over the IMD layer 100 filling the vias 104, 105 and covering the etch stop plate 86. The second metal layer 108 is formed in a like manner to the first metal layer 96, being comprised of an adhesion/barrier layer 105 of Ti/TiN, between about 200 and 400 Angstroms thick, deposited by sputtering; a layer 106 of an aluminum alloy, between about 0.4 and 0.9 microns thick, deposited by PVD or MOCVD; and an ARC 107 of TiN, between about 200 and 500 Angstroms thick, deposited by sputtering. Alternately, the ARC may be formed of TaN or silicon oxynitride. Alternately, another conductive material may be used to form the layer 108, for example aluminum, tungsten, copper, a tungsten alloy or a copper alloy.

Figure 2D:
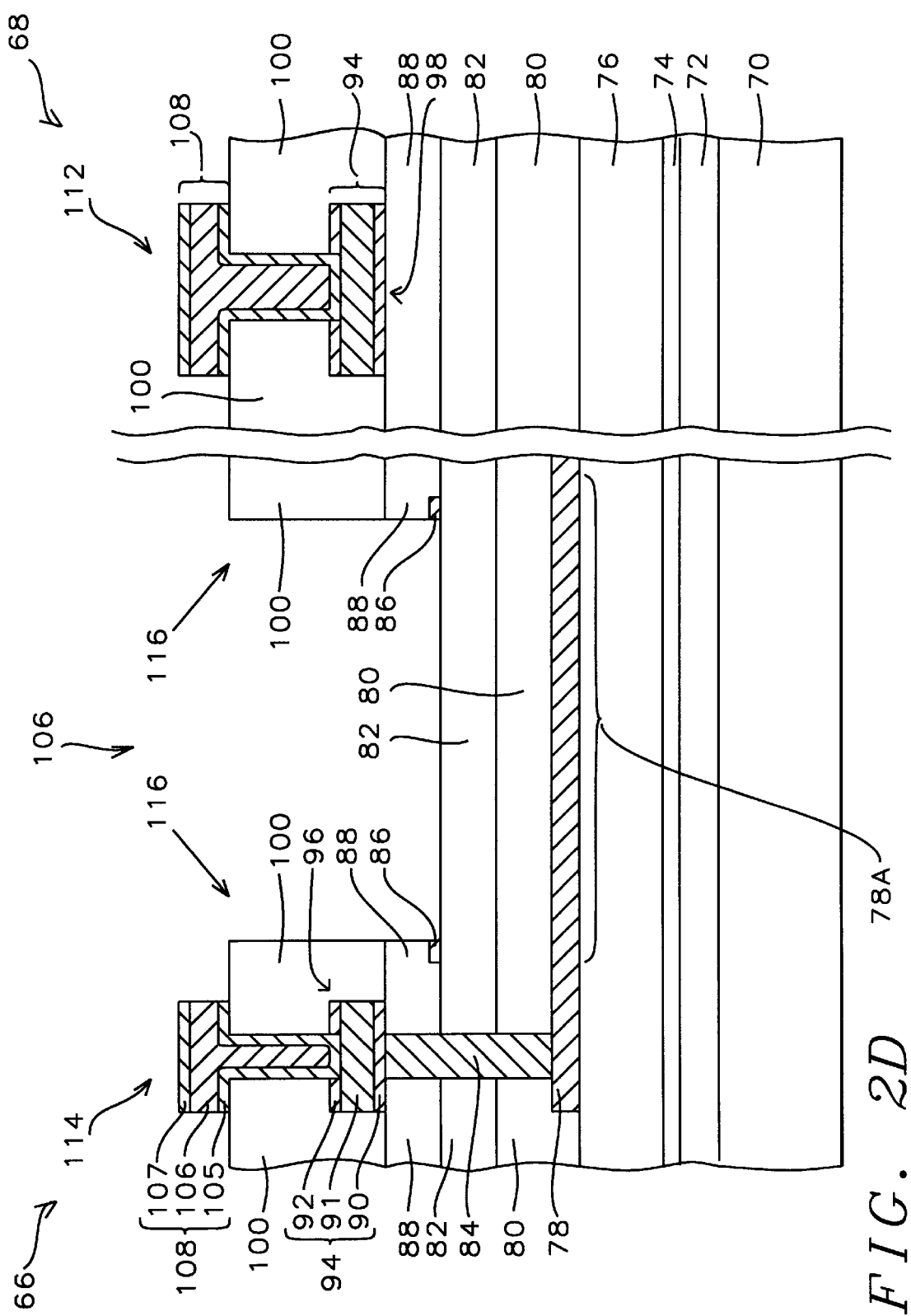

Photoresist 110 applied over the metallization layer 108 and patterned to define a bonding pad in the region 68 and an interconnection line in the region 66. Referring to FIG. 2D the second metallization layer 108 is anisotropically etched to form an interconnect line 114 and a bonding pad 112. Anisotropic etching is accomplished by plasma etching in a plasma containing $Cl_2$. A high metal-to-silicon oxide etch rate selectivity is chosen by selection of the etching parameters and etch gas composition. These procedures are well known by those in the art. In the course of the plasma etching, the etch stop plate 86 at the base of the fuse access opening 106 is also removed and the insulative layer 82 is exposed.

Although the plasma etching conditions are anisotropic, residual metal along the vertical walls 116 in the fuse opening 106 does not remain after the etch process. The etchant parameters may be optimized to achieve these plasma etching conditions by well known plasma etching parametric variation methods. However, if residual metal remains along the sidewalls 116, in particular, portions of the etch stop 86 in the slightly undercut region at the base of the opening 106, it is subsequently sealed off by a passivation layer and would therefore not become problematic.

The polysilicon etch stop 86 in the fuse access opening 106 has been removed in the second metal patterning step. An additional masking step at passivation etching to protect the bonding pads is not required, and the prior art limitation calling for different metals for the fuse and the second metal becomes moot. At the same time, the polysilicon etch stop plate 86 has overcome the non-uniformity contribution of the thick IMD layer 100 and also permitted sufficient over etch to assure thorough removal of the ARC on the first metal without loss of subjacent insulator over the fuse 78. It remains now to apply and pattern a passivation layer over the second metallization.

Figure 2E:
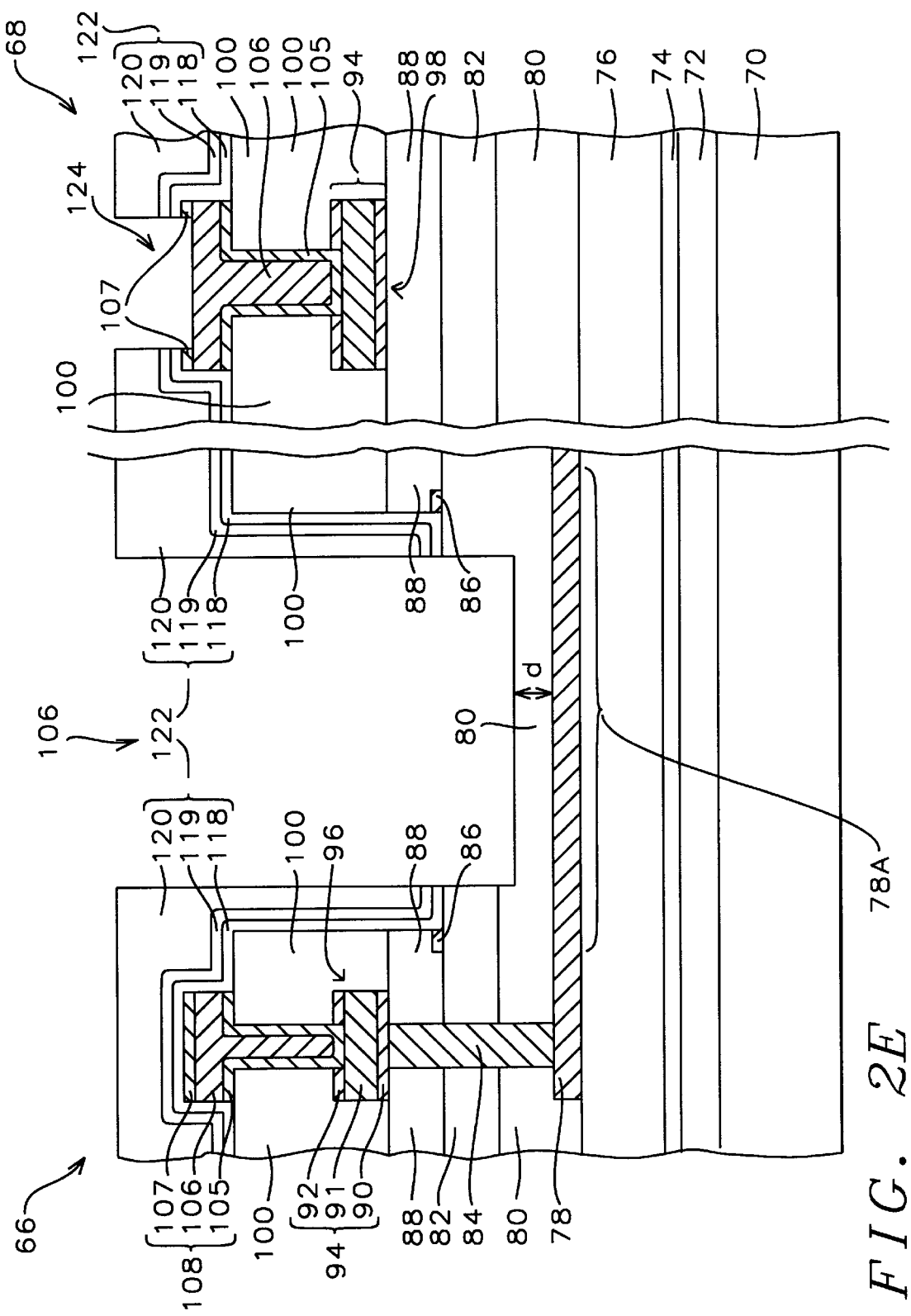

Referring to FIG. 2E, a silicon oxide layer 118 between about 0.4 and 0.7 microns thick is deposited over the wafer, covering the metallization pattern 106 with superjacent ARC 107. A silicon nitride layer 119, between about 0.4 and 0.7 microns thick is deposited on the silicon oxide layer 118. Finally, a polyimide layer 120 is deposited over the silicon nitride layer. The polyimide layer 120 is deposited to a thickness between about 8 and 12 microns by a spin on process which is well known. The passivation layer 122 comprises the silicon oxide layer 118, the silicon nitride layer 119 and the polyimide layer 120. Alternately the passivation layer 122 may take another form. For example the polyimide layer 120 may be omitted or replaced by a PSG (phosphosilicate glass) layer.

The passivation layer 122 is patterned by conventional photolithographic techniques and plasma etching or RIE methods, using etchant gases containing fluorocarbons, to deepen the opening 106 in the crown oxide layer 82 and to create an opening 124 to the bonding pad 56. After the etchant penetrates the passivation layer 122, etching is continued for time period to pass the opening 106 through the crown oxide layer 82 and penetrate the subjacent oxide layer 80, leaving a pre-determined thickness "d" of between about 0.2 and 0.6 microns of oxide over the fuse 78 at the base of the access opening 106. The ARC 107 exposed in the bonding pad opening 124, is entirely removed during this time period.

The embodiments uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated.

While the preferred embodiment describes the use of fuses formed in a first layer of polysilicon where they address word lines in a DRAM array, it should be understood that such fuses are also applicable under the scope of this invention which may be formed within other circuit levels. Similarly, while the embodiments describe two metallization levels with a single IMD, it should be likewise understood that the invention may address additional metallization levels with additional IMD layers and that the first portion of the laser access window would be etched during the uppermost via etch and the etch stop removed by the top level metallization patterning step.

Additionally, while this embodiment addresses laser trimming in a DRAM array, the applicability of this invention may be extended to other types of integrated circuits. While the invention has been particularly shown and described with reference to the preferred embodiments thereof, it will be understood by those skilled in the art that various changes in form and details may be made without departing from the spirit and scope of the invention.

What is claimed is:

1. A method for forming a laser accessible fuse comprising:
   (a) providing a silicon wafer having a first insulative layer;
   (b) depositing a layer of fusible material on said first insulative layer;
   (c) patterning said layer of fusible material to form a fuse with a rupture zone;
   (d) depositing a second insulative layer over said wafer;
   (e) forming conductive contacts to said fuse through openings in said second insulative layer, whereby said rupture zone is connected between, and in electrical series with, at least two of said conductive contacts;
   (f) depositing a first metal layer on said second insulative layer;
   (g) patterning said first metal layer to form conductive wiring connected to each of said at least of two conductive contacts, a plate over said rupture zone, and a wiring pad;
   (h) depositing a third insulative layer over said wafer;
   (i) patterning said third insulative layer to form a via opening to said wiring pad and a window opening over said rupture zone;
   (j) depositing a second metal layer on said wafer;
   (k) depositing an anti-reflective coating on said second metal layer;
   (l) patterning a bonding pad in said second metal later over said via opening and removing said anti-reflective coating, said second metal layer, and said first metal layer in said window opening;
   (m) depositing a passivation layer over said wafer; and
   (n) patterning said passivation layer by anisotropically etching said passivation layer and said anti-reflective coating over said bonding pad while simultaneously etching a region within said window opening, penetrating said second insulative layer to a final second insulative layer thickness over said rupture zone thereby forming a laser access window.

2. The method of claim 1 wherein said fusible material is polysilicon.

3. The method of claim 1 wherein said first metal layer is selected from the group consisting of aluminum, an aluminum alloy, tungsten, a tungsten alloy, copper, and a copper alloy.

4. The method of claim 1 wherein said anti-reflective coating is selected from the group consisting of TiN, TaN, and silicon oxynitride.

5. The method of claim 1 wherein said second insulative layer is between about 0.8 and 1.3 microns thick.

6. The method of claim 1 wherein said third insulative layer is silicon oxide between about 0.8 and 1.3 microns thick.

7. The method of claim 1 wherein said second metal layer is selected from the group consisting of aluminum, an aluminum alloy, copper, and a copper alloy.

8. The method of claim 1 wherein said passivation layer comprises a laminar structure consisting of a bottom layer of silicon oxide between about 0.4 and 0.7 microns thick, an intermediate layer of silicon nitride between about 0.4 and 0.7 microns thick, and a top layer of polyimide between about 8 and 12 microns thick.

9. The method of claim 1 wherein said passivation layer comprises a laminar structure consisting of a layer of silicon oxide between about 0.4 and 0.7 microns thick, and layer of silicon nitride, superjacent to said silicon oxide layer and between about 0.4 and 0.7 microns thick.

10. The method of claim 1 wherein said final second insulative layer thickness is between about 0.2 and 0.6 microns.

11. A method for forming a laser accessible fuse comprising:

(a) providing a silicon wafer having a first insulative layer;

(b) depositing a layer of fusible material on said first insulative layer;

(c) patterning said layer of fusible material to form a fuse with a rupture zone;

(d) depositing a second insulative layer over said wafer;

(e) depositing a polysilicon layer over said second insulative layer;

(f) patterning said polysilicon layer to form a plate over said rupture zone;

(g) depositing a third insulative layer over said wafer;

(h) forming conductive contacts to said fuse through openings in said second insulative layer and said third insulative layer, whereby said rupture zone is connected between, and in electrical series with, at least two of said conductive contacts;

(i) depositing a first metal layer on said third insulative layer;

(j) depositing a first anti-reflective coating on said first metal layer;

(k) patterning said first metal layer to form conductive wiring connected to each of said at least of two conductive contacts, an opening over said plate, and a wiring pad;

(j) depositing a fourth insulative layer over said wafer;

(k) patterning said fourth insulative layer, said first anti-reflective coating, and said third insulative layer coating to form a via opening to said wiring pad and a window opening over said plate, thereby exposing the surface of said plate;

(l) depositing a second metal layer on said wafer;

(m) depositing a second anti-reflective coating on said second metal layer;

(n) patterning a bonding pad in said second metal later over said via opening and removing said second anti-reflective coating, and said second metal layer;

(o) depositing a passivation layer on said wafer; and (p) patterning said passivation layer by anisotropically etching said passivation layer and said second anti-reflective coating over said bonding pad while simultaneously etching a region within said window opening, penetrating said second insulative layer to a final second insulative layer thickness over said rupture zone thereby forming a laser access window.

12. The method of claim 11 wherein said fusible material is polysilicon.

13. The method of claim 11 wherein said first metal layer is selected from the group consisting of aluminum, an aluminum alloy, tungsten, a tungsten alloy, copper, and a copper alloy.

14. The method of claim 11 wherein said first anti-reflective coating and said second anti-reflective coating are selected from the group consisting of TiN, TaN, and silicon oxynitride.

15. The method of claim 11 wherein said second insulative layer, said third insulative layer, and said forth insulative layer are between about 0.8 and 1.3 microns thick.

16. The method of claim 11 wherein said second metal layer is selected from the group consisting of aluminum, an aluminum alloy, tungsten, a tungsten alloy, copper, and a copper alloy.

17. The method of claim 11 wherein said passivation layer comprises a laminar structure consisting of a bottom layer of silicon oxide between about 0.4 and 0.7 microns thick, an intermediate layer of silicon nitride between about 0.4 and 0.7 microns thick, and a top layer of polyimide between about 8 and 12 microns thick.

18. The method of claim 11 wherein said passivation layer comprises a laminar structure consisting of a layer of silicon oxide between about 0.4 and 0.7 microns thick, and layer of silicon nitride, superjacent to said silicon oxide layer and between about 0.4 and 0.7 microns thick.

19. The method of claim 11 wherein said final second insulative layer thickness is between about 0.2 and 0.6 microns.

* * * * *